United States Patent [19]

Tran

[11] Patent Number: 5,408,694
[45] Date of Patent: Apr. 18, 1995

[54] RECEIVER SQUELCH CIRCUIT WITH ADJUSTABLE THRESHOLD

[75] Inventor: Toan V. Tran, San Jose, Calif.

[73] Assignee: National Semiconductor Corporation, Santa Clara, Calif.

[21] Appl. No.: 112,653

[22] Filed: Aug. 26, 1993

Related U.S. Application Data

[63] Continuation of Ser. No. 826,786, Jan. 28, 1992, abandoned.

[51] Int. Cl.⁶ .............................................. H04B 1/10
[52] U.S. Cl. .................................... 455/212; 455/220; 327/72
[58] Field of Search ...................... 455/212, 218, 220; 307/354, 356

[56] References Cited

U.S. PATENT DOCUMENTS

| | | | |
|---|---|---|---|
| 3,106,646 | 10/1963 | Carter | 455/220 |
| 3,550,007 | 12/1970 | Schmitt | 455/220 |
| 4,176,286 | 11/1979 | Shuffied, Jr. | 455/218 |
| 4,490,838 | 12/1984 | Nishioka et al. | 455/212 |
| 4,648,126 | 3/1987 | Toffolo | 455/212 |
| 4,743,779 | 5/1988 | Valley | 307/356 |
| 4,991,227 | 2/1991 | Kehler, Jr. | 455/220 |
| 5,003,196 | 3/1991 | Kawaguchi | 307/356 |
| 5,014,348 | 5/1991 | Boone et al. | 455/212 |
| 5,105,104 | 4/1992 | Eisele et al. | 307/354 |

FOREIGN PATENT DOCUMENTS 0070828  4/1985  Japan .................................. 455/220

Primary Examiner—Edward F. Urban
Attorney, Agent, or Firm—Limbach & Limbach; H. Donald Nelson; Stephen R. Robinson

[57] ABSTRACT

A receiver squelch circuit has a programmable DC threshold level. The squelch circuit includes input circuitry that responds to an incoming signal by generating a decision signal when the DC voltage level of the incoming signal crosses a predetermined threshold level. A programmable control network selectively varies the predetermined threshold level.

2 Claims, 3 Drawing Sheets

5,408,694

RECEIVER SQUELCH CIRCUIT WITH ADJUSTABLE THRESHOLD

This is a continuation of application Ser. No. 07/826,786, filed on Jan. 28, 1992, now abandoned.

BACKGROUND OF THE INVENTION

1. Field of the Invention

The present invention relates to data communication systems and, in particular, to a receiver squelch circuit having a programmable threshold.

2. Discussion of the Prior Art

The basic function of a data communications system is to transmit information over a communications channel from an information source to a destination that is physically separated from the source.

Some communications channels (e.g. twisted pair cables) have inherent characteristics that make it difficult for them to transmit digital data. To permit the transmission of digital data over these channels, it is necessary to convert the digital data at the point of transmission to a form that is compatible with the channel. This is done by utilizing the data to modulate a carrier waveform which is within the bandwidth of the channel. The modulated carrier waveform is then transmitted on the channel and demodulated at the receiver to recover the transmitted data.

While passing through the communication channel, the modulated signal suffers systematic distortion and noise contamination. Thus, a receiver typically includes a squelch circuit for filtering out noise from the received signal.

As shown in FIG. 1, a conventional squelch circuit utilizes specified positive and negative threshold levels $V_{THP}$ and $V_{THN}$, respectively, to establish valid data points in recovering data from the received input signal $R_x$.

Detection of threshold levels in the input signal $R_x$ is used to identify zero crossings ZC in the signal $R_x$ that represent valid data points D. Zero crossings that do not meet the established threshold level criteria are dismissed as noise.

Conventional squelch circuits, however, have fixed threshold levels. Thus, a particular squelch circuit can be used only in applications having a noise level safely below the circuit's threshold.

It would, therefor, be highly desireable to have available a receiver squelch circuit having a threshold that can be varied based on the measured noise level of the transmission system in which it is to be used.

SUMMARY OF THE INVENTION

The present invention provides a programmable receiver squelch circuit that includes input means responsive to an incoming signal for generating a decision signal when the DC voltage level of the incoming signal crosses a predetermined threshold voltage level and a programmable control network for varying the predetermined threshold voltage level.

A better understanding of the features and advantages of the present invention will be obtained by reference to the following detailed description and accompanying drawings which set forth an illustrative embodiment in which the principals of the invention are utilized.

DETAILED DESCRIPTION OF THE INVENTION

Figure 1:
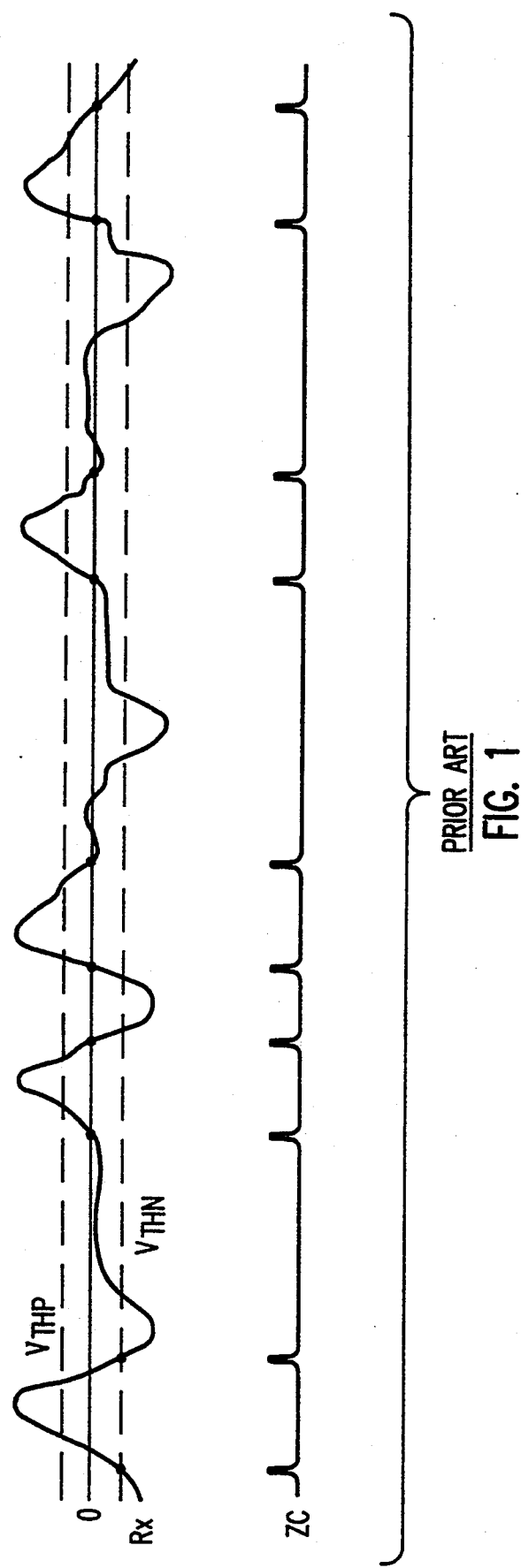
FIG. 1 is a timing diagram illustrating the fixed threshold level of a conventional receiver squelch circuit.
Figure 2:
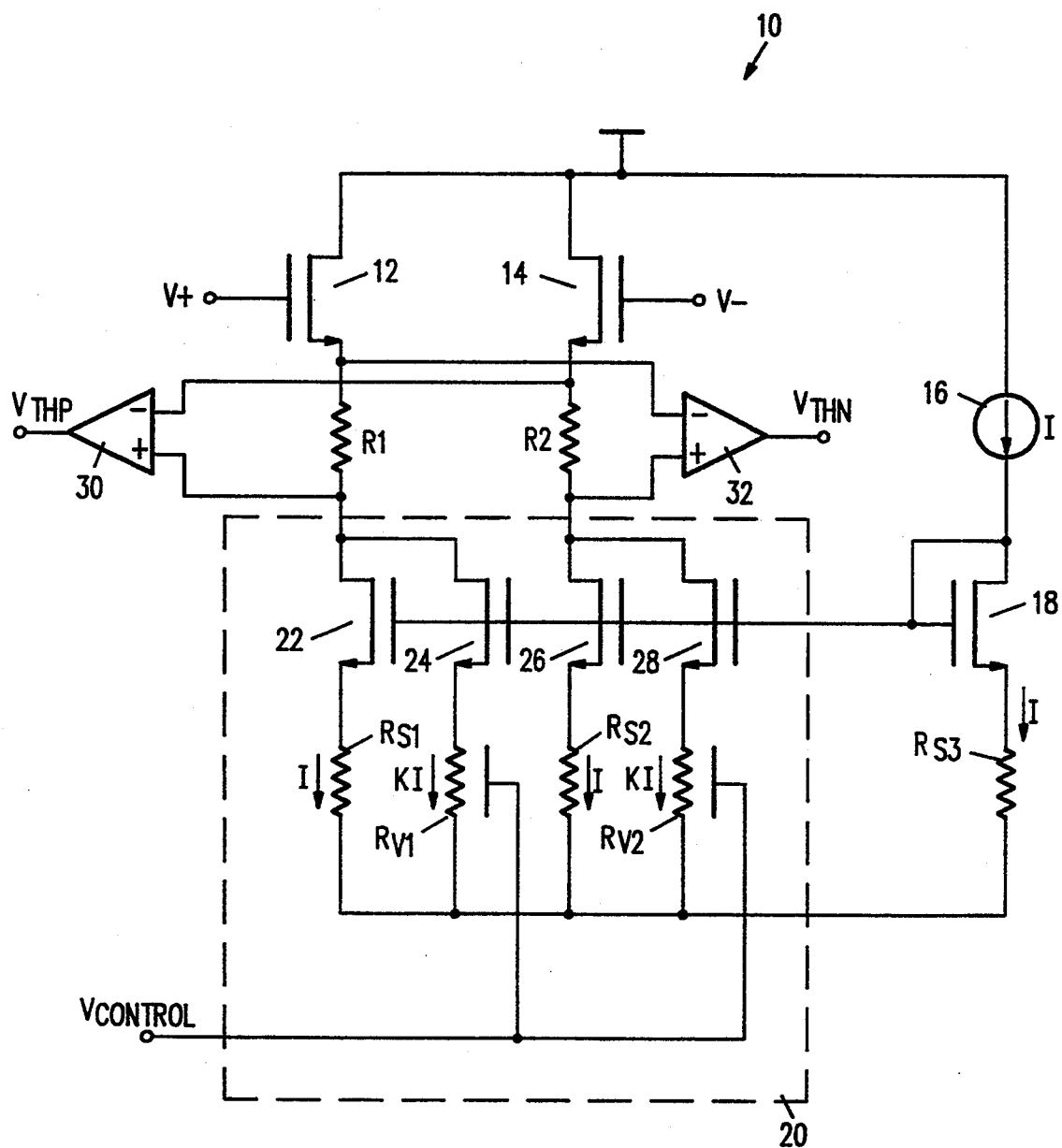
FIG. 2 is a schematic diagram illustrating an embodiment of a programmable receiver squelch circuit in accordance with the present invention.

FIG. 2 shows an embodiment of a receiver squelch circuit 10 in accordance with the present invention. The circuit 10 has a DC threshold level $V_{TH}$ that is programmable based on the level of an input control voltage signal $V_{CONTROL}$ that controls a resistor value, as will be described in greater detail below.

The squelch circuit 10 includes N-channel input transistors 12 and 14. Input transistors 12 and 14 are driven by a differential input signal, represented in FIG. 2 by input signals V+ and V−, provided, for example, by the two wires of a twisted pair cable.

Input transistor 12 has a load resistor R1 connected to its source. Load resistor R2 is similarly connected to the source of input transistor 14. Load resistors R1 and R2 are matched.

A current source 16 is connected to the positive supply in parallel with the input transistors 12 and 14 to drive diode-connected N-channel transistor 18. Resistor $R_{S3}$ is connected between the source of transistor 18 and the negative supply.

In accordance with the concepts of the present invention, a programmable control network 20 is provided for adjusting the threshold level of the squelch circuit 10 based on the noise level of the transmission system in which the circuit 10 is to be used.

Programmable control network 20 includes N-channel transistor 22 connected in series with resistor $R_{S1}$ between load resistor R1 and the negative supply. N-channel transistor 24 and variable resistor $R_{V1}$ provide a parallel branch connected between load resistor R1 and the negative supply.

Similarly, N-channel transistor 26 and resistor $R_{S2}$ are connected in series between load resistor R2 and the negative supply; N-channel transistor 28 and variable resistor $R_{V2}$ provided a parallel branch between load resistor R2 and the negative supply.

Resistors $R_{S1}$ and $R_{S2}$ are matched with resistor $R_{S3}$. Variable resistors $R_{V1}$ and $R_{V2}$, which are controlled by input control voltage signal $V_{CONTROL}$, are also matched. Transistors 22, 24, 26 and 28 have their gates commonly-connected to the gate of transistor 18 in current mirror fashion.

As shown in FIG. 2, current I provided by current source 16 is mirrored through transistor 18 to transistors 22, 24, 26 and 28, all of which are matched. Since resistors $R_{S1}$, $R_{S2}$ and $R_{S3}$ are matched, current through transistors 18, 22 and 26 = I. Current through transistor 24 and 28, however, is controlled by the values of the variable resistors $R_{V1}$ and $R_{V2}$, respectively, which are set by the control signal $V_{CONTROL}$.

Thus, the voltage drop across load resistors R1 and R2, which is a measure of the circuit's threshold voltage $V_{TH}$, is:

$V = (I + kI)R_2$, with $0 < k < 1$.

Since (I+kI) can vary from I to 2I, the voltage drop, and thus the threshold voltage $V_{TH}$ of the circuit 10, can also be varied by a factor of 2 based on the voltage level of control signal $V_{CONTROL}$.

Squelch circuit 10 includes two comparators 30 and 32 for monitoring the positive and negative thresholds $V_{THP}$ and $V_{THN}$, respectively.

Comparator 30 has its inverting input connected to the "input side" node of load resistor R2 and its non-inverting input connected to the "output side" node of load resistor R1. Thus, the voltage at the inverting input must be higher than that at the non-inverting input by the value of the positive threshold voltage $V_{THP}$ to obtain a "high" output from comparator 30 indicating that the positive threshold voltage $V_{THP}$ has been crossed.

Comparator 32 has its inverting input connected to the "input side" node of load resistor R1 and its non-inverting input connected to the "output side" node of load resistor R2. Thus, the voltage at the inverting input must be higher than that at the non-inverting input by the value of the negative threshold voltage $V_{THN}$ to obtain a "high" output from comparator 32 indicating that the negative threshold voltage $V_{THN}$ has been crossed.

Figure 3:
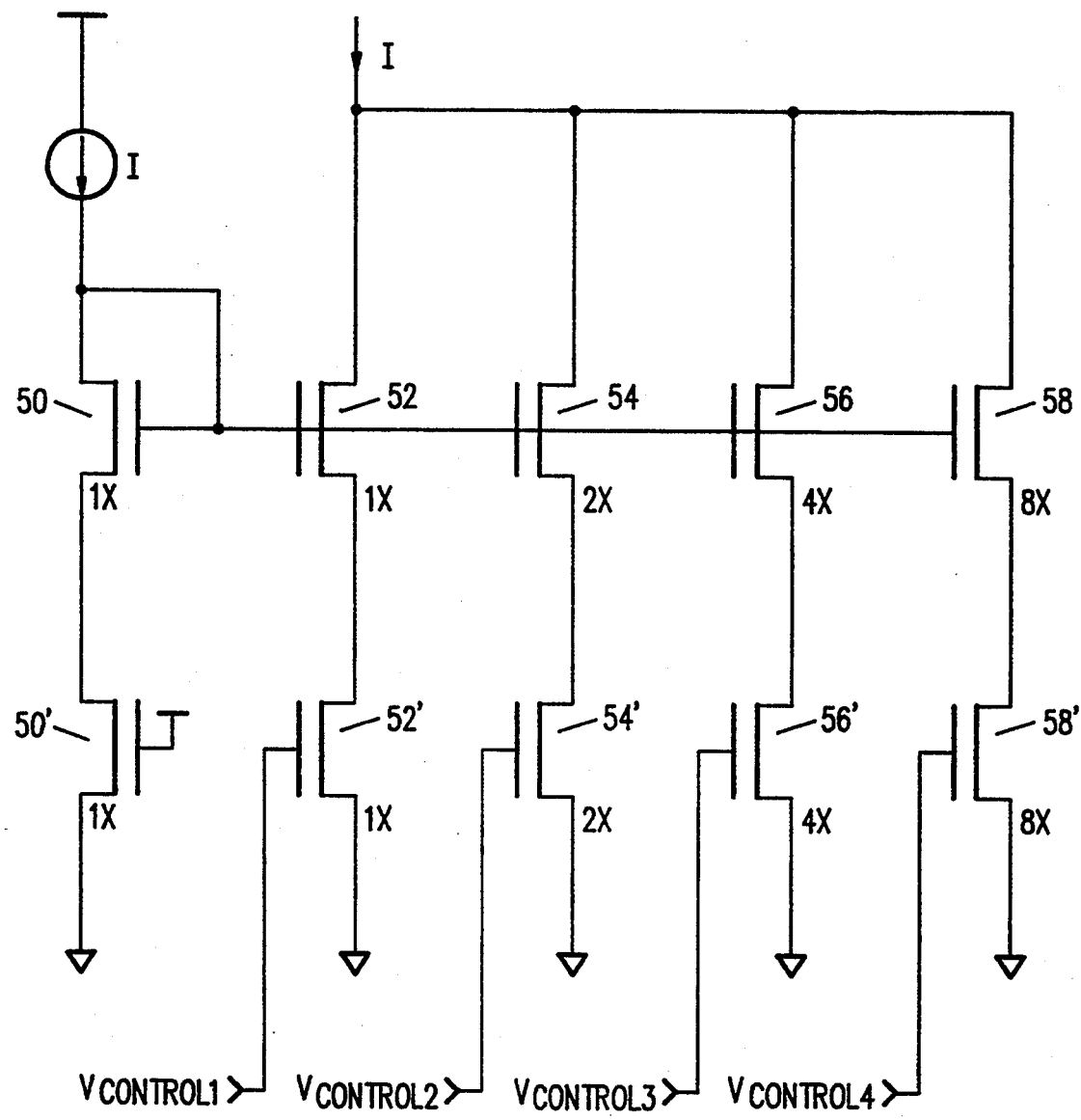
FIG. 3 is a schematic diagram illustrating a digital embodiment of a programmable control network utilizable in a receiver squelch circuit in accordance with the present invention.

FIG. 3 shows an alternative digital embodiment of the programmable control network 20. As shown in FIG. 3, rather than utilizing an analog control signal to establish the threshold voltage $V_{TH}$ of the squelch circuit 10, a set of MOS transistors 52, 54, 56, 58 of different sizes is connected to current mirror transistor 50. The on/off status of the control transistors 52', 54', 56' and 58' is determined by a multi-bit digital input to the chip which establishes which of the gate drive signals $V_{CONTROL1}$-$V_{CONTROL4}$ be logic high and which will be logic low. The combination of transistors 52', 54', 56' and 58' that is "on" will determine the threshold voltage $V_{TH}$ of the squelch circuit 10. For example, if signals $V_{CONTROL1}$ and $V_{CONTROL3}$ are high (i.e. transistors 52' and 56' are "on") and signals $V_{CONTROL2}$ and $V_{CONTROL4}$ are low (i.e. transistors 54' and 58' are off), then the threshold voltage of the circuit 10 will be (5I)R$_1$. FIG. 3 shows an example of the relative sizes (i.e. w/L ratios) of MOS transistors 52, 54, 56 and 58 and of their respective corresponding control transistors 52', 54', 56' and 58'.

Those skilled in the art will readily appreciate that the FIG. 3 concept can be expanded by multiples of 2 by expanding the digital input to the chip and adding the corresponding number of control transistor branches to the circuit 10.

It should be understood that various alternatives to the embodiments of the invention described herein may be employed in practicing the invention. It is intended that the following claims define the scope of the invention and that methods and circuits within the scope of these claims and their equivalents be covered thereby.

What is claimed:

1. A programmable receiver squelch circuit comprising:
    (a) first and second N-channel input transistors driven by a differential input signal;
    (b) first and second matched load resistors, an input-side node of each of the first and second load resistors being connected, respectively, to the source node of the first and second N-channel input transistors;
    (c) a current source connected to a positive supply in parallel with the first and second N-channel input transistors;
    (d) a diode-connected N-channel transistor having its gate and drain commonly-connected and connected to the current source;
    (e) a first source resistor connected between the source of the diode-connected N-channel transistor and a negative supply;
    (f) a first N-channel source transistor connected in series with a second source resistor between an output-side node of the first load resistor and the negative supply;
    (g) a first N-channel control transistor connected in series with a first variable resistor means between the first load resistor and the negative supply;
    (h) a second N-channel source transistor connected in series with a third source resistor between an output-side node of the second load resistor and the negative supply;
    (i) a second N-channel control transistor connected in series with a second variable resistor means between the second load resistor and the negative supply;
    wherein the first, second and third source resistors are matched, and
    wherein the first and second variable resistor means are controlled by a variable input control voltage signal, and
    wherein the first and second N-channel source transistors and the first and second N-channel control transistors have their gates commonly-connected to the gate of the diode-connected N-channel transistor in current mirror fashion,
    (j) first comparator means having its inverting input connected to the input-side node of the second load resistor and its non-inverting input connected to the output-side node of the first load resistor; and
    (k) second comparator means having its inverting input connected to the input-side of the first load resistor and its non-inverting input connected to the output-side node of the second load resistor.

2. A programmable receiver squelch circuit comprising:
    (a) first and second N-channel input transistors driven by a differential input signal;
    (b) first and second matched load resistors, an input-side node of each of the first and second load resistors being connected, respectively, to the source node of the first and second N-channel input transistors;
    (c) a current source connected to a positive supply in parallel with the first and second N-channel input transistors;
    (d) a diode-connected N-channel transistor having its gate and drain commonly-connected and also connected to the current source, the diode-connected N-channel transistor having a pre-defined w/L ratio;
    (e) a first N-channel control transistor having its drain connected to the source of the diode-connected N-channel transistor, its source connected to ground and its gate connected to the positive supply, the first N-channel control transistor having a w/L ratio that is the same as the pre-defined w/L ratio of the diode-connected N-channel transistor;

(f) a first positive threshold N-channel source transistor, having its drain connected to an output-side node of the first load resistor and its gate commonly-connected to the gate of the diode-connected N-channel transistor in current mirror relationship, the first positive threshold N-channel source transistor having the pre-defined w/L ratio, the first positive threshold N-channel source transistor having a first positive threshold N-channel control transistor associated therewith, the first positive threshold N-channel control transistor having its drain connected to the source of the first positive threshold N-channel source transistor, its source connected to ground, and its gate connected to receive a first bit of a digital control signal, the first positive threshold N-channel transistor also having the pre-defined w/L ratio;

(g) a plurality of additional positive threshold N-channel source transistors, each additional positive threshold N-channel source transistor having its drain connected to the output-side node of the first load resistor and its gate commonly-connected to the gate of the diode-connected N-channel transistor, each additional positive threshold N-channel source transistor having a w/L ratio different from the w/L ratio of the other additional positive threshold N-channel source transistors and different from the pre-defined w/L ratio, each additional positive threshold N-channel source transistor having a corresponding additional positive threshold N-channel control transistor associated therewith, said corresponding additional positive threshold N-channel control transistor having the same w/L ratio as the associated additional positive threshold N-channel source transistor and having its drain connected to the source of the associated additional positive threshold N-channel source transistor, its source connected to ground and its gate connected to receive a corresponding bit of the digital control signal; and (h) negative threshold control circuitry connected between an output-side node of the second load resistor and ground and responsive to a control signal for controlling current flow therethrough.

* * * * *